United States Patent
Mattila et al.

(10) Patent No.: US 7,145,402 B2
(45) Date of Patent: Dec. 5, 2006

(54) MULTI-MODE FREQUENCY SYNTHESIZER WITH TEMPERATURE COMPENSATION

(75) Inventors: Tomi Mattila, Espoo (FI); Olli Jaakkola, Helsinki (FI); Ville Kaajakari, Espoo (FI); Aarne Oja, Espoo (FI); Heikki Seppä, Helsinki (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 11/157,400

(22) Filed: Jun. 20, 2005

(65) Prior Publication Data

US 2005/0285692 A1    Dec. 29, 2005

Related U.S. Application Data

(63) Continuation of application No. PCT/FI2004/000384, filed on Jun. 24, 2004.

(51) Int. Cl.
  H03B 1/00 (2006.01)
  H03B 5/30 (2006.01)
  H03L 1/02 (2006.01)
  H03L 7/06 (2006.01)

(52) U.S. Cl. .................... 331/66; 331/16; 331/17; 331/18

(58) Field of Classification Search ............... 331/1 A, 331/16–18, 25, 65–66, 175–176; 327/156–159; 329/325; 332/127; 360/51; 375/376; 455/260
See application file for complete search history.

(56) References Cited

U.S. PATENT DOCUMENTS 5,604,468 A    2/1997  Gillig ................... 331/176
6,278,337 B1   8/2001  Chan et al. ............ 331/116
6,995,622 B1 * 2/2006  Partridge et al. ........ 331/66

FOREIGN PATENT DOCUMENTS

WO    WO 93/15555    8/1993

OTHER PUBLICATIONS

De Los Santos, H., "RF MEMS Circuit Design for Wireless Communications", 1999, ISBN No. 1-58053-329-9, 12 pgs.

Kaajakari, V. et al., "Square-Extensional Mode Single-Crystal Silicon Micromechanical RF-resonator", Transducers '03, 12th International Conference on Solid State Sensors, Actuators and Microsystems, Boston, Jun. 8-12, 2003, pp. 951-954.

Dominguez, M. et al., "A Sigma-Delta Digital Oscillator for MEMS", Proc. Of IEEE Sensors 2003, Oct. 22-24, 2003, vol. 2, pp. 834-838.

* cited by examiner

*Primary Examiner*—David Mis
(74) *Attorney, Agent, or Firm*—Harrington & Smith, LLP

(57) ABSTRACT

Method for stabilizing the frequency of a frequency synthesizer by means of a reference oscillator unit coupled to a voltage controlled oscillator (VCO) and a frequency synthesizer, wherein the synthesizer is provided with a phase locked loop (PLL) to stabilize the operation of the voltage controlled oscillator, wherein the reference oscillator unit is a MEMS (MicroElectromechanicalSystems) reference oscillator unit, the temperature of the MEMS reference oscillator unit is measured, and the output frequency is corrected according to the measured temperature by using a frequency/temperature function.

21 Claims, 7 Drawing Sheets

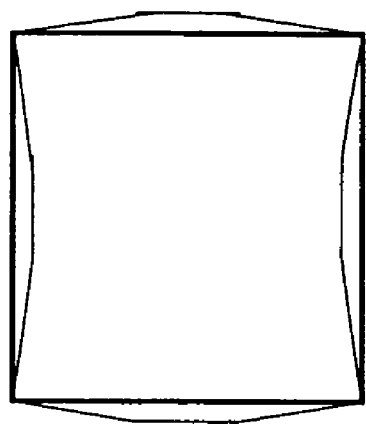
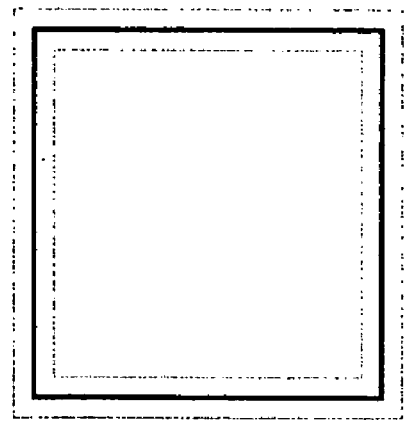
Fig. 3a                Fig. 3b
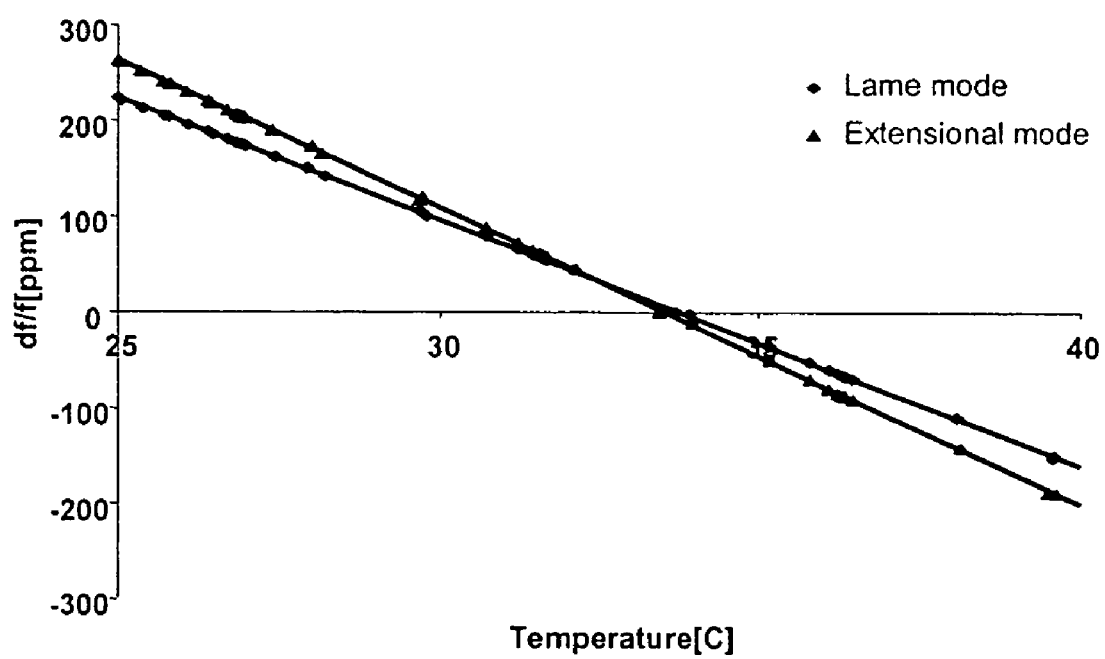
Fig. 4

MULTI-MODE FREQUENCY SYNTHESIZER WITH TEMPERATURE COMPENSATION

CROSS REFERENCE TO RELATED APPLICATION

This application is a continuation of International Patent Application No. PCT/FI2004/000384, filed on Jun. 24, 2004.

FIELD OF INVENTION

The present invention relates to a method for stabilizing the frequency of a frequency synthesizer. More specifically, the present invention relates to a method for stabilizing the frequency of a frequency synthesizer by means of a reference oscillator coupled to a voltage controlled oscillator (VCO) by using a phase locked loop (PLL). The present invention also relates to a frequency synthesizer.

BACKGROUND OF THE INVENTION

In typical modern wireless transceivers the communication frequency is derived from a reference oscillator. For example, in a wireless hand-set a frequency based on the reference oscillator is used to initiate the communication with a base station. After the connection has been established, the frequency accuracy may further be improved by various synchronization methods, but the initial communication frequency must be accurate enough to enable the establishment of the initial communication.

In a typical transceiver architecture, the output of a reference oscillator is phase-locked to the output of a VCO and the output of the VCO provides the desired local oscillator (LO) frequency.

An example of such PLL based frequency generation is depicted in FIG. 1a. The output 13 of the phase comparator 12 is used to stabilize the operation of the VCO 14; the output frequency 15 of the VCO 14 will be the reference oscillator frequency 11 multiplied with the dividing factor N of the divider chain 16.

The basic PLL based frequency generation utilizes an integer counter chain as frequency divider, but the fractal version uses a fractal divider which alternates between two different dividing modulo, typically under control of a sigma-delta converter, to approximate a continuous output frequency range.

The PLL based frequency generation depicted in FIG. 1a can be developed into the frequency synthesizer depicted in FIG. 1b if the dividing factor N is arranged to be dynamically changeable.

In addition to the requirement to provide long-term frequency accuracy for the VCO, a low reference oscillator phase noise is needed because the less phase noise a LO generated carrier contains, the better the communication channel will be suitable to provide error free information transfer.

Reference oscillators are used as precise and stable frequency references in frequency synthesizers and to provide a precise and stable reference frequency signal to enable the generating of a variable but stable frequency that can be used as a tunable LO-frequency.

The critical requirements for the output frequency signal of a frequency synthesizer is stability, low phase noise and a high thermal stability, e.g. having low thermal coefficient, and additionally the requirement that a precise value for the output frequency can be selected rapidly.

In wireless communication devices the reference oscillator has conventionally been based on quartz crystals. The stable and precise mechanical vibration of quartz resonators suits well for creation of an oscillator that has excellent long term (drift and aging) and short-term (phase noise) stability. Furthermore, by proper quartz preparation methods (e.g. AT-cut) the temperature dependence of the resonance frequency can be reduced to a low value (less than a few ppm for the typical operation temperature range). The central disadvantages of quartz crystal reference oscillator modules are their rather bulky size and difficulty for monolithic integration with the transceiver module that is otherwise typically based on highly integrated solutions. Modern micromachining makes it possible to fabricate miniaturized mechanical resonators (MicroElectroMechanical Systems=MEMS) with resonance frequencies ranging from several kHz up to the GHz range. Examples of such microresonators based on surface or bulk micromachining of silicon are presented in H. J. De Los Santos, "RF MEMS Circuit Design for Wireless Communications", Artech House, Boston/London, 2002. The advantages of microresonators include small size, low power consumption, and possibility for increased integration level between the resonator, the oscillator electronics, and the device package. Both monolithic integration and the system-on-chip approach are viable solutions for increasing the integration level of a reference oscillator. Monolithic integration of micromachined resonators and integrated circuits facilitates more complicated microelectro-mechanical circuits, and can provide complete on-chip frequency synthesizers.

However, a fundamental complication in using silicon-based microresonators in frequency synthesizers arises from their large temperature coefficient, typically the df/dT from −10 to −30 ppm/K. Such a temperature dependence is far too large for a reference application if left unaccounted for. Compensation of this temperature dependency is therefore required to make microresonators suitable as frequency references for frequency synthesizers.

SUMMARY OF THE PRESENT INVENTION

It is an object of the present invention to eliminate the disadvantages of the prior art and to provide an improved method for stabilizing the frequency of a frequency synthesizer, and an improved frequency synthesizer.

The present Invention provides a LO frequency synthesizer architecture in which a MEMS reference oscillator unit having a non-zero temperature coefficient is used for frequency stabilization, and where the temperature-dependence of the reference frequency is accounted for at the synthesizer level.

The present invention is based on the principle that the resonator temperature is measured in order to electronically compensate for the temperature dependency and the resulting temperature dependent frequency shift. By measuring the temperature T of the MEMS resonator as depicted in FIG. 1c and by using the known frequency vs. temperature function $f_r(T)$, the resonance frequency becomes a precisely defined quantity that can be used to improve the stability of the prior art frequency synthesizer according to FIG. 1b.

In a preferred embodiment the temperature measurement is based on exciting two modes in a MEMS resonator having different temperature coefficients. By looking at the frequency shift of the two modes, the change in temperature can be measured and electrically compensated. This method has the following advantages: 1) no temperature sensor is needed eliminating temperature transient hysteresis associated with temperature difference of the sensor and the resonator, 2) frequency measurement is accurate and is straightforward to realize digitally, and 3) no additional sensors are needed as the resonator is also the sensor. This simplifies fabrication and reduces costs.

Characteristic features of the present invention are in detail presented in the enclosed claims.

The main advantage of the methods presented in the present invention is that because the rather large (but predictable) temperature dependence of a MEMS-oscillator is taken into account directly in the frequency synthesis, the long-term stability and low phase noise for the reference oscillator can be better optimized as the oscillator itself can be left running uncompensated. Using the described methods, the MEMS-reference oscillator can be (monolithically) integrated as a part of a wireless transceiver module.

BRIEF DESCRIPTION OF DRAWINGS

The foregoing, and additional objects, features and advantages of the present invention will be more clearly understood from the following detailed description of preferred embodiments of the present invention, taken in conjunction with accompanying drawings, in which:

FIGS. 3a and 3b illustrates two vibration modes observed for a square plate resonator having different temperature coefficients, FIG. 4 discloses measured frequency coefficients for two square plate vibration modes.

DETAILED DESCRIPTION OF THE INVENTION

The present invention relates to a method for stabilizing the frequency of a frequency synthesizer by using a reference oscillator coupled to a voltage controlled oscillator (VCO) using a phase locked loop (PLL) or a frequency comparison control, wherein a reference MEMS oscillator is utilized for stabilization of the VCO, whereby by measuring the temperature T of the MEMS resonator and by using its known frequency vs. temperature function $f_r(T)$, the output frequency becomes a precisely defined quantity that can be used as a reference in frequency synthesizers.

In the following three stabilization methods are presented for MEMS-oscillator-based frequency synthesizers.

Figure 1A:
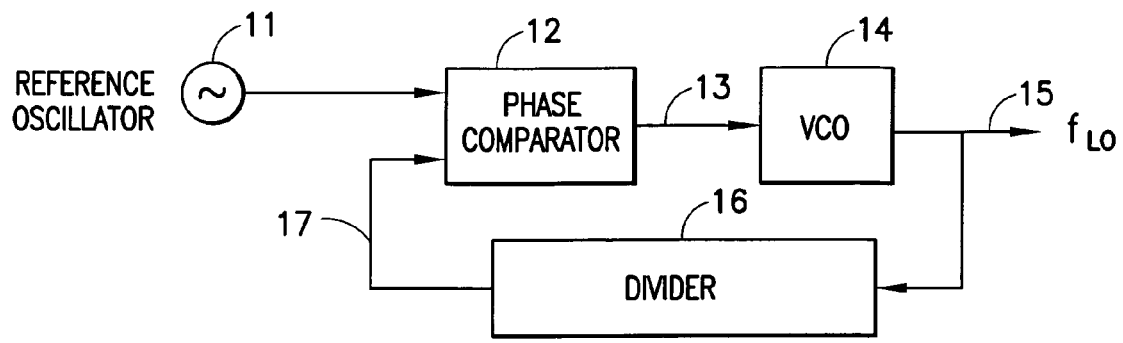
FIG. 1a is a block diagram of a typical PLL based frequency synthesizer where the VCO generates the LO frequency.
Figure 1B:
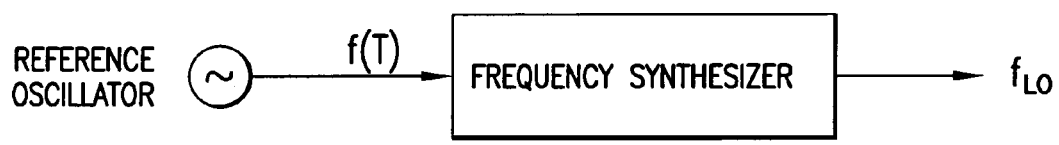
FIG. 1b is a simplified block diagram of a frequency synthesizer.
Figure 1C:
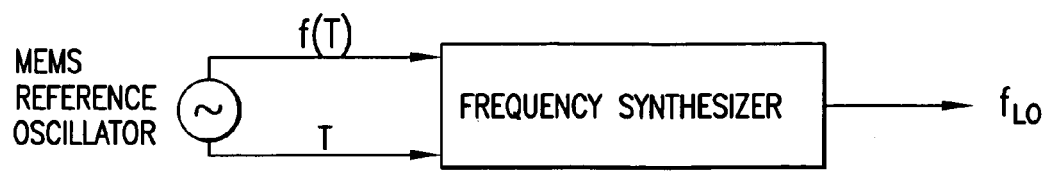
FIG. 1c is a simplified block diagram of a frequency synthesizer according to the invention.
Figure 2A:
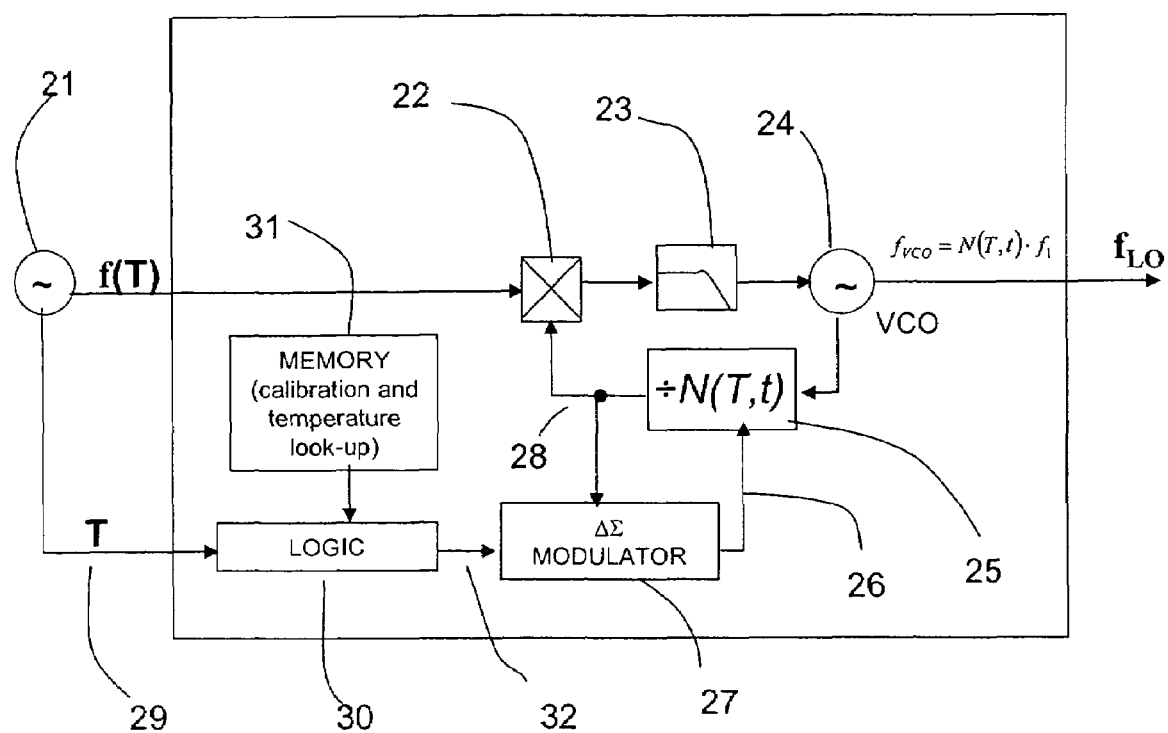
FIG. 2a is a block diagram of a frequency synthesizer, according to a preferred embodiment of the invention.

According to a first method, with a block diagram depicted in FIG. 2a, the VCO 24 generates the LO-frequency (e.g. at 1 GHz) $f_{Lo}$. The MEMS-reference oscillator 21 is typically operated at a significantly lower frequency (e.g. at 10 MHz). The VCO output frequency is divided in the divider 25 in order to make the output frequency 28 of the divider equal to the MEMS-reference oscillator frequency. Their relative phase is detected by the phase detector 22 and after low pass filtering (LPF) 23 the result is used to stabilize the VCO 24 This loop forms a basic PLL, as described earlier.

The frequency of the MEMS reference oscillator 21 is not stable with temperature, but its temperature-dependent frequency offset can be compensated by modifying the divider 25.

A previously known fractional-N divider technique that is continuously tunable can conveniently be used to adjust the counting of the divider chain 25. It can be realized by using e.g. a sigma-delta modulator technique that continuously adjusts the count module N of the frequency divider stage. Using the sigma-delta modulator 27 to adjust 26 the divider 25, the VCO frequency becomes N+x[n] times the reference frequency and can be made to be nearly continuously adjustable. N denotes the module integer setting of the frequency divider and x[n] is the phase detector output signal 28 that is used to control the sigma-delta modulator 27.

Based on the measured 29 temperature T of the MEMS reference 21 and the T-dependency f(T) of the MEMS reference 21, a LOGIC circuitry 30 is used to generate a x[n] 32 signal that makes the delta-sigma modulator 27 compensate the temperature-induced output frequency offset of the MEMS reference oscillator 21.

The said compensating is by means of the delta-sigma modulator 27 adjusting the modulo N of the divider chain 25. The LOGIC circuitry 30 can advantageously use a look-up table 31 that provides the needed correction control signal x(n) selected using the measured temperature T of the reference oscillator 21. The fabrication tolerance offset in reference frequency can as well be calibrated and used to additionally adjust x[n] in the same way by using for example a two dimensional look-up table 31 or a suitable combining algorithm.

The MEMS reference oscillator 21 is realized using techniques described later. Long-term stability and low phase noise for the reference oscillator can be provided using a single MEMS-oscillator based on bulk acoustic wave (BAW) operation. If necessary, an improved performance for the reference oscillator can be realized using two or more MEMS components whose properties are selectively combined. For example, the long-term stability and low phase noise for the reference oscillator can be derived by combining the properties of two MEMS-components.

Figure 2B:
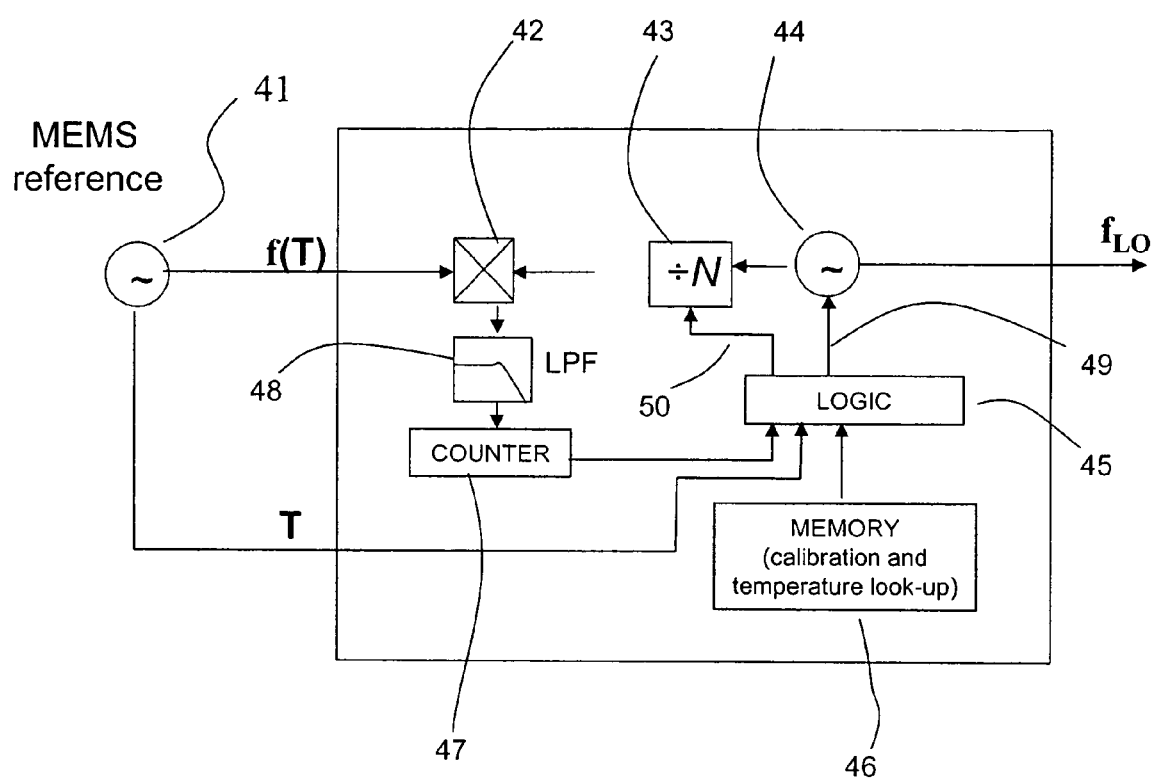
FIG. 2b is a block diagram of a simplified frequency synthesizer according to an embodiment of the invention.

The block diagram of the second method is depicted in FIG. 2b. It illustrates the case where the VCO 44 is capable of generating a signal with the required spectral purity (phase noise) by itself and the reference oscillator 41 is needed only for providing the long-term frequency stability.

In this case, the VCO feedback loop can be made very narrow band, and a constant integer-N division can be used in the divider 43 to generate the an output to be mixed in the mixer 42 with the reference frequency from the reference oscillator 41. The mixer 42 outputs the sum and difference frequencies of the mixed frequencies but after low pass filtering 48 only the low frequency difference frequency fbeat=fr−fVCO/N (or fVCO/N−fr) between the reference frequency fr and the divided VCO output frequency fVCO/N remains, and can be used to generate a control signal for the VCO that adjusts the VCO to output the desired frequency. It is important to note that the VCO output signal does not have to be constant multiple of the reference signal. By proper selection of the difference frequency fbeat, fine tuning of the output frequency fvco=N·(fr−fbeat) is possible. This can be used to digitally compensate the temperature induced change in the reference oscillator, The VCO control signal 49 is generated by the logic circuit 45 and to this control signal further correction control voltages can be added in order to generate a tuning voltage for the VCO that additionally corrects for the reference oscillator temperature dependent frequency offset and/or for offsets found during calibration as well.

The described mixing method can only be used if the relative frequency sense of the frequencies does not change. Another more general method is to determine the frequency difference and its sense by directly counting the two relative low frequency signals fr and fVCO/N using one common signal to gate the counters. This clock can for example be either of the said signals.

The logic circuit 45 outputs a tuning control voltage 49 that depends on the frequency difference in such way as to make the difference frequency between the divided VCO output frequency and the reference frequency closer to the desired frequency difference.

A voltage depending on the measured oscillator temperature T and any calibration correction can additionally be arranged to adjust the tuning voltage for the VCO 44, advantageously by simply using look up tables and a DAC. In the same way as previously described for the first method, the look-up tables can contain both calibration correction values and correction values that depend on the known temperature dependent behaviour of the MEMS reference oscillator.

An advantageous embodiment of this method is to use the frequency difference to control the VCO by analog methods and digitally adjust the integer counter chain for temperature and calibration correction using the logic circuit 45 and the control signal 50 to change the dividing modulo of the divider counter chain 43.

Whenever a synthesizer divider is dividing using integer values (e.g. for channel selection), the logic circuit can rapidly provide the channel selection if it is fed information of the desired channel, in the example of FIG. 2b the LOGIC circuit 45 could directly provide the temperature corrected N needed for the desired channel and thus provide rapid channel selection.

This method for rapid channel selection in a transceiver is not limited to the method depicted in FIG. 2b but can be used whenever correction values are arranged to modify the counter chain. This method can thus be used with the preferred embodiment as well. In a favourable embodiment, not shown, a three dimensional table is used instead of a two dimensional correction table in order to provide the correction values for all combinations of fabrication calibration correction, reference oscillator temperature correction and the channel selection frequency offsets.

Providing a temperature, calibration or channel corrected N value to a counter chain can be accomplished many other ways obvious to a person skilled in the arts. For example in addition to changing the modulo of the counter chain or using fractal methods, the count value of the counter itself can be modified by adding or subtracting counts at a regular rate in order to increase or decrease the output frequency. This method, commonly used in phase accumulators to give a fixed phase offset, can easily be modified for continuous phase change, which in effect provides controlled increase or decrease in output frequency.

Figure 2C:
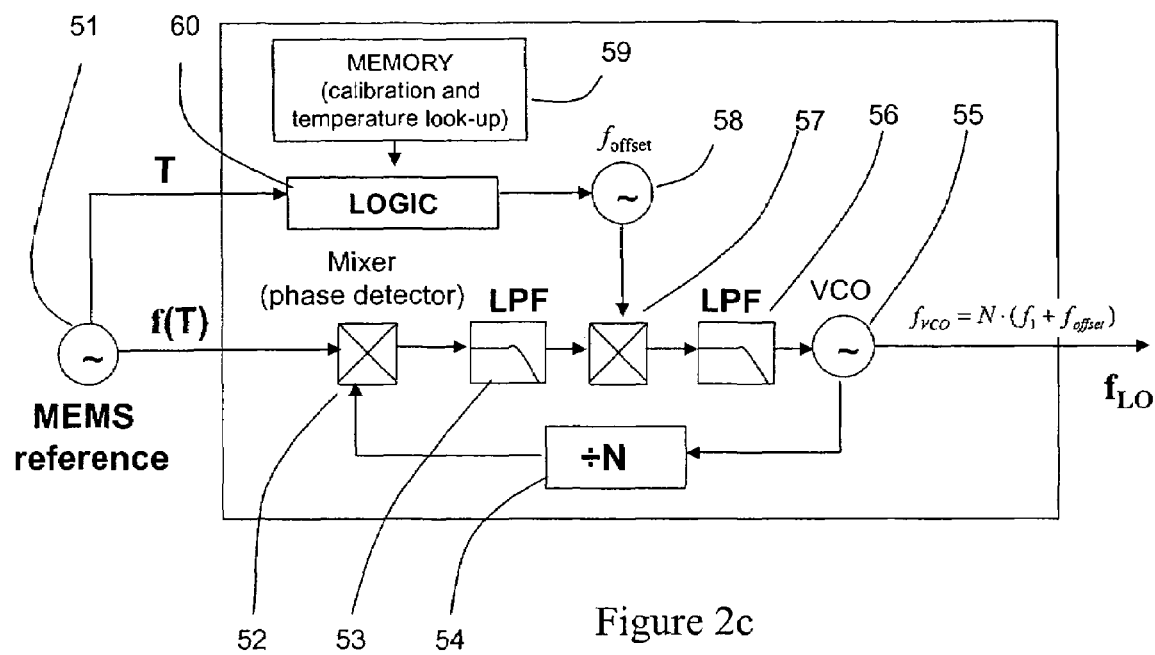
FIG. 2c is a block diagram of a frequency synthesizer according to another embodiment of the present invention.

FIG. 2c is a block diagram of frequency synthesizer according to another embodiment of the present invention where an offset synthesizer is used for temperature stabilization of the VCO 55 output frequency. The VCO generates the LO-frequency (e.g. at 1 GHz) $f_{Lo}$. The MEMS-reference oscillator 51 provides the reference frequency, typically 10 MHz. The VCO output frequency is divided in the divider 54 and the divided VCO output is mixed with the reference oscillator using the mixing phase detector 52. The mixer output is filtered with a low pass filter 53 to obtain f1=fVCO−fr. The second mixer 57 is used to add an offset frequency foffset provided by a oscillator 58 to the signal. After filtering with the second low pass filter 56 the resulting frequency f2=f1−foffset is obtained. When the phase-loop is locked the frequency f2 is zero and the VCO output equals fVCO=N·(fr+foffset).

The frequency of the MEMS reference oscillator 51 is not stable with temperature, but its temperature-dependent frequency offset can be compensated by adjusting the foffset. Based on the measured temperature T of the MEMS reference and the T-dependency f(T) of the MEMS reference 51, a LOGIC circuitry 60 and a look-up table 59 is used to control the offset oscillator 58. The offset oscillator may be a VCO or a MEMS oscillator with a wide tuning range (e.g. flexural oscillator).

According to another embodiment of the present invention a silicon resonator is excited simultaneously in two modes, each mode having a different temperature coefficient. An example of a useful resonator structure showing these two types of modes is shown in FIG. 3. FIG. 3a illustrates extensional mode vibration (at f0=13.1 MHz, Q=120 000) in a plate and FIG. 3b the Lamé mode vibration (at f0=12.1 MHz, Q=60000). The extensional vibration mode is characterised as a 2-D plate expansion that preserves the original square shape. The Lamé mode is characterized as plate bending that preserves the plate volume. The component can be made by deep reactive ion etching of silicon-on-insulator (SOI) wafer. The electrical contact to the resonator can be done with corner anchoring (T-type corner anchoring) so that the entire device can be fabricated with one mask. The extensional mode has additionally been shown to be very suitable to obtain low phase noise V. Kaajakari, T. Mattila, A. Oja, J. Kiihamäki, H. Kattelus, M. Koskenvuori, P. Rantakari, I. Tittonen and H. Seppä: "Square-Extensional Mode Single-Crystal Silicon Micromechanical RF-resonator", paper to be published in Transducers '03 (Boston, June, 2003). FIG. 4 shows the measured temperature dependency for the two modes, which is different from each other.

Figure 5A:
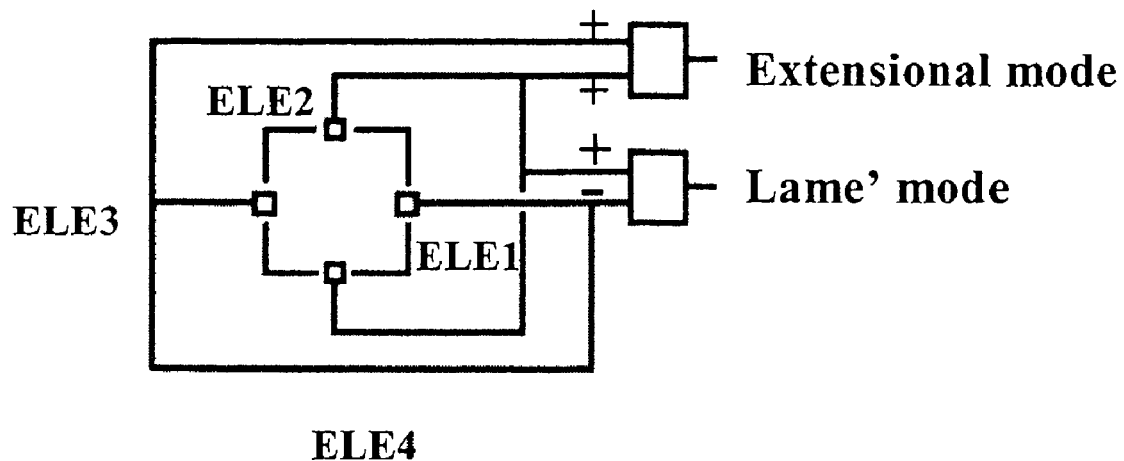
FIGS. 5a, 5b illustrates two methods to simultaneously detect the two square plate vibration modes.
Figure 5B:
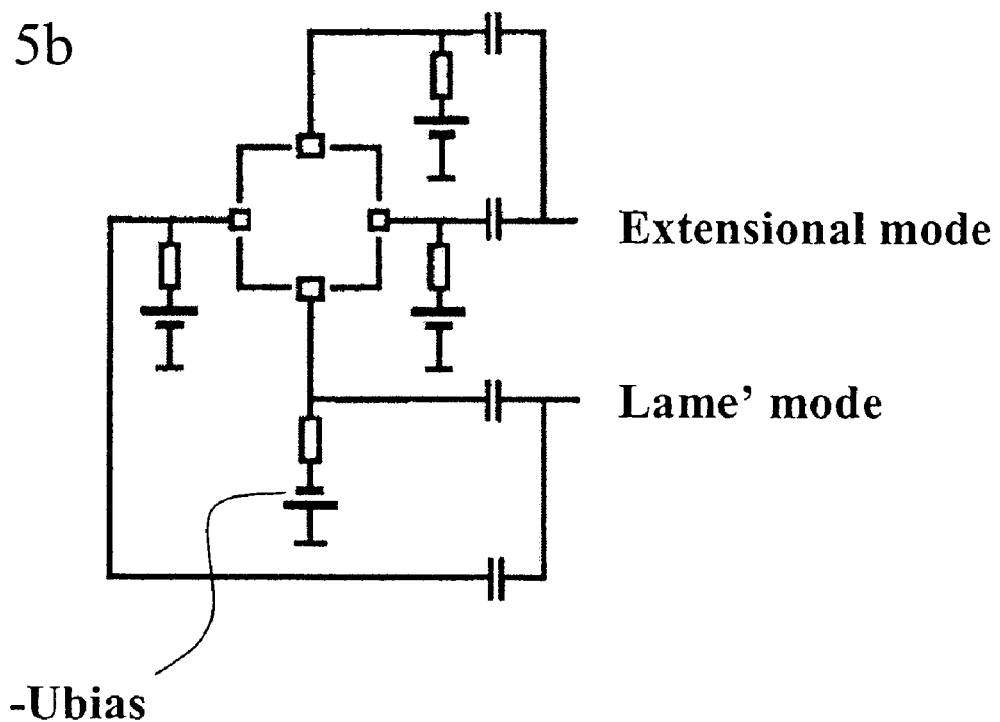

Simultaneous and independent detecting of the two vibrations is depicted in FIG. 5a and FIG. 5b. In FIGS. 5a and 5b the acoustic mode (BAW) silicon resonator is shown comprising a square plate, electrodes ELE1–ELE4 providing capacitive coupling on all sides of the plate, voltage sources $U_{in}$ and $U_{bias}$ connected to the electrodes and output voltage. With the differential electrode configuration shown in FIG. 5a, the two modes can be detected with the same electrodes. This gives maximum signal amplitude for both modes but complicates the oscillator electronics. The configuration shown in FIG. 5b uses different electrodes with different bias (differential polarity for the other Lamé-electrode) to excite and/or excite the Laméand extensional-modes. The driving electronics is simpler and the two modes have good isolation, but the configuration is not optimal for signal power. For simplicity, the electrode size for the two modes are shown equal but a practical implementation may use larger electrodes for the mode that is used to generate the reference frequency and smaller electrodes for the mode that is used for generating the temperature information.

An alternative to detecting the two modes in the same resonator is to fabricate two resonators in close thermal contact (e.g. on a same substrate), driving one resonator in plate extensional mode and driving the other in Lamé mode. Since these resonators are on same silicon substrate, the resonator temperatures are highly correlated. The benefit of this configuration is that the modes are electrically and mechanically isolated and the oscillator electronics is simplified.

Other microresonator configurations can also be used to generate the temperature information. For example, it is possible to obtain the temperature information from torsional and flexural beam vibration modes as these two modes have different temperature dependency as well. Alternatively, two resonator made of different materials with different temperature dependency can be used.

The temperature information that is needed for the frequency compensation can be generated as follows: The two modes resonate at frequencies f1 and f2. Both modes are excited simultaneously and the pulses generated by the two resonances are detected as earlier described and counted in a counter 1 and 2, respectively. If the counter 1 has stored N1 cycles, then the counter 2 has stored $N2=f2/f1 \cdot N1$ cycles in the same time. Keeping N1 fixed, the temperature can thus be obtained.

Such temperature information can be used by the present invention to correct the output frequency of a frequency synthesizer according to the first method, its simplified form and the third method. Other temperature measuring methods can be used as well to implement frequency correction, but the two-mode method is particularly suited for use with MEMS reference oscillators.

Figure 6:
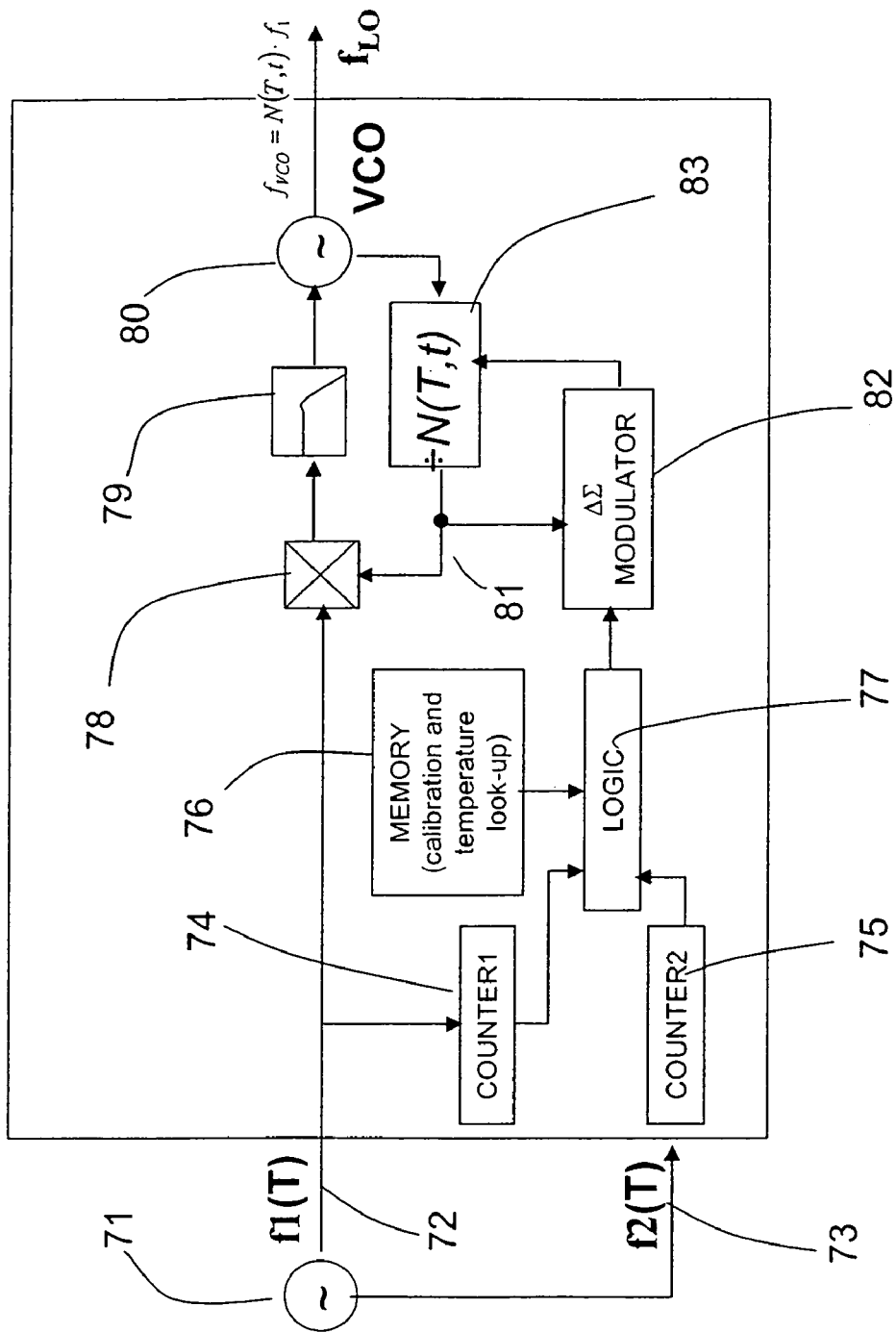
FIG. 6 illustrates the preferred embodiment of the invention implemented with the temperature information extracted from two mode measurement.

This two-mode method can directly be used to make a reference oscillator used for a high frequency synthesizer as depicted in FIG. 6. The depicted synthesizer uses a reference oscillator and a fractional-N phase-locked loop. The reference oscillator 71 has two frequency outputs 72 and 73 that have different temperature dependency. The frequency output 72 is designed to have low phase noise. These outputs 72 and 73 are counted with COUNTER1 74 and COUNTER2 75. The counter outputs are used by the logic circuitry 77 to calculate the oscillator temperature as earlier has been described. The temperature information together with stored calibration information in the memory 76 is used calculate the correct division factor N in the divider 83 that yields the desired LO frequency given by $fVCO=N \cdot f1$. Since the f1 depends on temperature, the required division N factor may be fractional and not an integer.

The desired frequency is synthesized using a VCO 80 to generate the LO frequency. The VCO output frequency is divided in the divider 83 in order to make the output frequency 81 of the divider equal to the MEMS-reference oscillator frequency 72. The divisional factor in the divider 83 is changed by the fractional sigma-delta modulator 82 in a previously described manner. The LOGIC 77 circuitry is used to control the sigma-delta modulator to obtain fractional division. The relative phase between the reference oscillator signal 72 and the divided signal 81 is detected by the phase detector 78 and after low pass filtering in the LPF 79, the phase comparison result is used to stabilize the VCO 80. This loop forms a basic PLL, as described earlier.

The reference oscillator 71 is designed so that the output signal 72 primarily has low phase noise and only secondarily high temperature stability. The desired LO frequency is synthesized using a voltage controlled oscillator that has a low quality factor, and is therefore locked to the reference oscillator for good stability in order to provide a low jitter LO signal, needed for carrier signals and other uses.

Any reference oscillator frequency shift is corrected using fractional division of the VCO frequency using a fractional-N modulator.

Stored calibration values and the known temperature dependency is used by the logic circuitry to control the fractional-N modulator.

The fractional-N PLL can advantageously be implemented using a sigma-delta modulator. This technology offers nearly continuous frequency tuning and has been demonstrated to be able to satisfy the GSM phase noise specifications.

It is obvious to the person skilled in the art that different embodiments of the invention are not limited to the example described above, but that they may be varied within the scope of the enclosed claims.

The invention claimed is:

1. Method for stabilizing the frequency of a frequency synthesizer by means of a reference oscillator unit coupled to a voltage controlled oscillator (VCO), wherein the synthesizer is provided with a phase locked loop (PLL) to stabilize the operation of the voltage controlled oscillator, characterised in that:
exciting two modes in a reference oscillator unit that is a MicroElectromechanical Systems (MEMS) resonator, the two modes having different temperature coefficients,
measuring a temperature of the reference oscillator unit by a frequency shift of the two modes,
correcting an output frequency of the MEMS resonator according to the measured temperature by using a frequency/temperature function.

2. Method for stabilizing the frequency of a frequency synthesizer according to claim 1, further comprising generating a local oscillator frequency from a voltage controlled oscillator (VCO), dividing the local oscillator frequency to equal the MEMS reference oscillator frequency, and detecting and using their relative phase to tune the voltage controlled oscillator,
characterised in that a divider is used to compensate for a temperature-dependent reference frequency offset error of the MEMS resonator.

3. Method for stabilizing the frequency of a frequency synthesizer according to claim 2, characterised in that the divider is a tunable fractional-N divider realized using a sigma-delta modulator technique, whereby in using the sigma-delta modulator feedback to the tunable divider, the local oscillator frequency is N+x[n] times the reference frequency, where N denotes an integer setting of the tunable divider and x[n] is the input sequence to guide a sigma-delta modulator, and, based on a measured temperature (T) of the MEMS resonator (T) and the reference frequency T-dependence fr(T), a logic circuitry is used to generate an x[n] that compensates the output frequency of the MEMS resonator for temperature.

4. Method for stabilizing the frequency of a frequency synthesizer according to claim 2, characterised in that the voltage controlled oscillator is capable of generating a signal with a required spectral purity by itself and the reference oscillator is needed for providing long-term frequency stability, whereby the difference between the reference frequency fr and a VCO frequency (fVCOIN) is resolved by counting a frequency difference of fr−fVCO/N, wherein the frequency difference is then combined with the measured T and known function fr(T) to generate a corrected turning voltage for the VCO.

5. Method for stabilizing the frequency of a frequency synthesizer according to claim 2, characterised in that the voltage controlled oscillator is capable of generating a substantially spectrally pure signal by itself and the reference oscillator is needed for providing long-term frequency stability, whereby the difference between the reference frequency fr and the VCO frequency (fVCO/N) is be resolved by directly counting the two frequencies fr and fVCO/N wherein the frequency difference is then combined with the measured T and known function fr(T) to generate a correctd tuning voltage for the VCO.

6. Method for stabilizing the frequency of a frequency synthesizer according to claim 1, characterised in that the temperature compensation for the MEMS reference oscillator frequency in a frequency-upconversion phase locked loop (PLL) is done using a low-frequency oscillator that can be tuned.

7. Method for stabilizing the frequency of a frequency synthesizer according to claim 1, wherein an output frequency of the frequency synthesizer is provided by an output frequency of a voltage controlled oscillator (VCO), characterised in that an offset synthesizer is used for temperature stabilization of the VCO output frequency, that the VCO generates a local oscillator (LO) frequency, the MEMS-reference oscillator provides the reference frequency, the VCO output frequency is divided in a divider and a signal corresponding to the divided VCO output frequency fVCO is mixed with the reference oscillator frequency fr using a mixing phase detector to provide an output signal of frequency f1, that the mixer output signal is filtered with a low pass filter to obtain f1=fVCO−fr, that a second mixer is used to add a signal corresponding to an offset frequency (foffset) provided by an oscillator to the output signal of frequency f1, and that after filtering with the second low pass filter a resulting signal of frequency f2=f1−foffset is obtained.

8. Method for stabilizing the frequency of a frequency synthesizer according to claim 1, further comprising continuously adding or subtracting at a constant rate in a phase accumulator in a phase locked loop counter chain a correction value to increase or decrease the output frequency of the MIEMS resonator depending on the temperature.

9. Frequency synthesizer, provided with a reference oscillator coupled to a voltage controlled oscillator (VCO) for stabilizing the frequency of a frequency synthesizer, wherein the synthesizer is provided with a phase locked loop (PLL) to stabilize the operation of the voltage controlled oscillator, characterised in that:
a reference oscillator unit is a MicroElectromechanical-System (MEMS) reference oscillator unit,
means for measuring the temperature of the MEMS reference oscillator unit, and
means for correction of the output frequency of the MEMS reference oscillator unit according to the measured temperature by using a frequency/temperature function, the MEMS reference oscillator unit having two modes with different temperature coefficients.

10. Frequency synthesizer r according to claim 9, characterised in that the reference oscillator unit comprises a micromechanical bulk acoustic mode (BAW) silicon resonator with a square plate and electrodes for capacitive coupling arranged on all sides of the square plate, wherein a vibration mode is characterised as a 2-D plate expansion that preserves an original square shape of the square plate.

11. Frequency synthesizer according to claim 9, further comprising a VCO, means for generating the local oscillator frequency from the VCO, means for dividing the local oscillator frequency to equal the MEMS reference oscillator frequency, and means for detecting their relative phase difference and for tuning the voltage controlled oscillator.

12. Frequency synthesizer according to claim 11, characterized by a divider to compensate a temperature-dependent reference frequency offset error of the MLEMS reference oscillator unit.

13. Frequency synthesizer according to claim 11, characterised in that the means for dividing the local oscillator frequency comprises a tunable fractional-N divider that comprises a sigma-delta modulator.

14. Frequency synthesizer according to claim 11, characterised in that voltage controlled oscillator has means for generating a sufficiently spectrally pure signal by itself and the reference oscillator provides long-term frequency stability.

15. Frequency synthesizer according to claim 9, further comprising an offset synthesizer comprising a voltage controlled oscillator (VCO) used for temperature stabilization of a VCO output frequency, and that VCO generating a local oscillator (LO) frequency, the MEMS-reference oscillator providing the reference frequency, the VCO dividing the output frequency by a frequency divider and the divided VCO output being mixed with the reference oscillator using a first mixer to provide a mixer output, the mixer output being filtered with a low pass filter to obtain first signal f1=fVCO−fr, a second mixer used to add an offset frequency (foffset) signal provided by a logic controlled oscillator to the signal, further comprising means for obtaining, after filtering with a second low pass filter, resulting frequency synthesizer output frequency f2=f1−foffset.

16. Frequency synthesizer according to claim 9, further comprising an electrode configuration.

17. Frequency synthesizer according to claim 16, characterised in that the electrode configuration has means for detecting the two modes with the same electrodes.

18. Frequency synthesizer according to claim 16, characterised in that the electrode configuration has different electrodes with different bias to excite each of the two modes.

19. Frequency synthesizer according to claim 16, characterised in that the electrode configuration has different resonators for excitation of the two modes.

20. Frequency synthesizer according to claim 9, characterized in that the frequency synthesizer has a three dimensional table in order to provide the correction values for all combinations of fabrication calibration correction, reference oscillator temperature correction and the channel selection frequency offsets.

21. A frequency synthesizer, comprising:
  a frequency reference oscillator unit that is a MEMS (MicroElectromechanicalSystems) reference oscillator unit,
  a voltage controlled oscillator,
  means for measuring the temperature of the MEMS reference oscillator unit and for correction of the output frequency of the MEMS reference oscillator unit according to the measured temperature by using a frequency/temperature function, and
  a phase-locked loop (fractional-N PLL), whereby the frequency reference oscillator unit gives out frequencies (f1) and (f2) used to generate temperature information, the oscillator being designed so that the signal frequency f1 has low phase noise, and a desired frequency is synthesized by the voltage controlled oscillator (VCO).

* * * * *

UNITED STATES PATENT AND TRADEMARK OFFICE
CERTIFICATE OF CORRECTION

PATENT NO. : 7,145,402 B2
APPLICATION NO. : 11/157400
DATED : December 5, 2006
INVENTOR(S) : Tomi Mattila et al.

It is certified that error appears in the above-identified patent and that said Letters Patent is hereby corrected as shown below:

Column 9, line 46, delete "(fVCOIN)" and insert --(fVCO/N)--.

Column 9, line 60, delete "correctd" and insert --corrected--.

Column 10, line 24, delete "MIEMS" and insert --MEMS--.

Column 10, line 55, delete "MLEMS" and insert --MEMS--.

Signed and Sealed this

Thirteenth Day of February, 2007

JON W. DUDAS
*Director of the United States Patent and Trademark Office*